United States Patent [19]

Bacrania et al.

[11] Patent Number: 5,059,982
[45] Date of Patent: * Oct. 22, 1991

[54] BACK-SAMPLING ANALOG TO DIGITAL CONVERTER

[75] Inventors: Kantilal Bacrania; Chong I. Chi, both of Palm Bay, Fla.

[73] Assignee: Harris Corporation, Melbourne, Fla.

[*] Notice: The portion of the term of this patent subsequent to Jan. 1, 2008 has been disclaimed.

[21] Appl. No.: 587,089

[22] Filed: Sep. 24, 1990

Related U.S. Application Data

[63] Continuation-in-part of Ser. No. 340,705, Apr. 20, 1989, Pat. No. 4,982,194.

[51] Int. Cl.$^5$ ............................................. H03M 1/38
[52] U.S. Cl. ...................................... 341/172; 341/161
[58] Field of Search ............... 341/122, 153, 150, 155, 341/157, 161, 162, 172

[56] References Cited

U.S. PATENT DOCUMENTS

| | | | |
|---|---|---|---|
| 4,129,863 | 12/1978 | Gray et al. | 341/172 |
| 4,200,863 | 4/1980 | Hodges et al. | 341/172 X |
| 4,388,612 | 6/1983 | Takagi et al. | 341/150 X |
| 4,531,113 | 7/1985 | Abraham et al. | 341/172 X |
| 4,641,130 | 2/1987 | Mastroianni | 341/172 X |

Primary Examiner—Howard L. Williams
Attorney, Agent, or Firm—Barnes & Thornburg

[57] ABSTRACT

Analog to digital conversion begins by terminating the acquisition phase of the analog input signal and immediately starting the successive approximation conversion phase upon receipt of a start conversion command. Upon the completion of the successive approximation conversion phase and latching the result, the array is rest if required. The comparator offset is sampled-and-held, if required, and the acquisition phase is initiated and continues until the receipt or occurrence of the next start conversion command.

12 Claims, 2 Drawing Sheets

BACK-SAMPLING ANALOG TO DIGITAL CONVERTER

CROSS-REFERENCE

This application is a continuation-in-part of U.S. Ser. No. 340,705 filed Apr. 20, 1989, now U.S. Pat. No. 4,982,194.

BACKGROUND AND SUMMARY OF THE INVENTION

The present invention relates generally to analog-to-digital converters, and more specifically to an improvement in analog-to-digital converters.

Analog-to-digital converters include three distinctive phases of a cycled operation, namely an adjustment phase for offset or gain, an input acquisition phase, and a conversion phase. These phases are described specifically in U.S. Pat. No. 4,282,515 to Raymond B. Patterson, III. A block diagram of an analog-to-digital converter is illustrated in FIG. 1 as including, for example, an eight-bit successive approximation register, an eight-bit weighted resistive array constituting a digital-to-analog converter, an input sample-and-hold, high speed analog comparator, a latch and a digital output buffer. A controller is provided which receives the input analog signal $V_{IN}$, a reference signal $V_{REF}$, an analog ground and a start conversion command signal SC, which may be a digital or analog input signal.

Analog-to-digital converters using charge redistribution techniques provide an inherent sample-and-hold function for acquisition as well as offset adjustment or cancellation. Such a system is shown in FIG. 2 and described in an article "All-MOS Charge Redistribution Analog-to-Digital Conversion Techniques— Part 1", J. McCreary and P. Gray, IEEE, J. Solid State Circuits, vol. SC-0, pp. 371–379, December 1975. The controller controls the circuity of FIG. 2 to produce the sequence illustrated in the graphs of FIG. 3.

As illustrated in FIG. 3, upon receipt of the start command signal SC the capacitors of the array are discharged by connecting both terminals to ground in response to a discharge signal DC. Upon completion of the discharging of the capacitive array, which takes approximately 100 nanoseconds, after which acquisition cycle begins. After a settling time of approximately 100–200 nanoseconds, allowing for the transient loading effects, the offset cancellation of the comparator begins and is illustrated by the pulse SO. This is the first phase of the circuits adjustment and compensation as described above.

The acquisition cycle, illustrated by the signal ACQ, lasts approximately 700 nanoseconds and begins with the sampling of the comparator offset. Only after acquisition of an analog input signal, provided as an input to the capacitor array, has been completed, can the successive approximation portion of the cycle or conversion begin. The successive approximation cycle is represented by the eight cycles of SAR for the eight-bit successive approximation register and takes approximately 1 microsecond. Upon termination of the successive approximation routine, the digital value is fixed by latching, illustrated by the LATCH signal in the graphs of FIG. 3.

The elapsed time between the start conversion command SC and the beginning of the successive approximation routine SAR, is approximately 1.1 microseconds. This is an aperture delay defined as the time lag between the start conversion command and the instant when the input is actually held on the capacitor array. With internal timing generation, it is not apparent to the user when the sampling of the input signal is completed and the exact instance when the conversion starts. This sequence makes the converter unsuitable for digital signal processing applications, where the instance at which the input is sampled is very important.

Also aperture jitter, defined as the uncertainty in time between the hold or termination of acquisition command and the instant the analog input is actually disconnected from the capacitor array, is important. In prior art methods, this signal is internally generated by timing circuits and the aperture jitter is in the range of 10 to 100 nanoseconds.

The timing diagram of FIG. 3 is also applicable to the analog-to-digital converter of FIG. 1. The capacitive discharge signal DC would represent a resetting signal of the DAC in FIG. 1. The acquisition signal would be the beginning of the sampling and end with a hold signal at which point the successive approximation in FIG. 1 would occur.

Thus, it is an object of the present invention to provide an analog to-digital converter which is suitable for digital signal processing applications.

Another object of the present invention is to provide an analog-to-digital converter with reduced aperture delay and aperture jitter.

These and other objects of the invention are achieved by terminating the acquisition phase of the analog input signal and immediately starting the successive approximation conversion phase upon receipt of a start conversion command signal. Upon the completion of the successive approximation conversion phase, the result is fixed by latching. This is followed by resetting the array, if necessary, and initiation of the acquisition phase and, if necessary, of sample-and-holding or cancelling for the comparator offset. The acquisition phase begins at the termination of the latching and continues until the receipt or occurrence of the next start conversion command. Thus, the present invention reduces the aperture jitter and aperture delay to substantially zero and performs the reset, offset correction and acquisition phase after the termination of the conversion phase and will be referred to as the "back-sampling" technique. Initiating the successive approximation conversion phase using the start conversion command signal reduces aperture jitter.

Other objects, advantages and novel features of the present invention will become apparent from the following detailed description of the invention when considered in conjunction with the accompanying drawings.

DETAILED DESCRIPTION OF THE DRAWINGS

Figure 2:
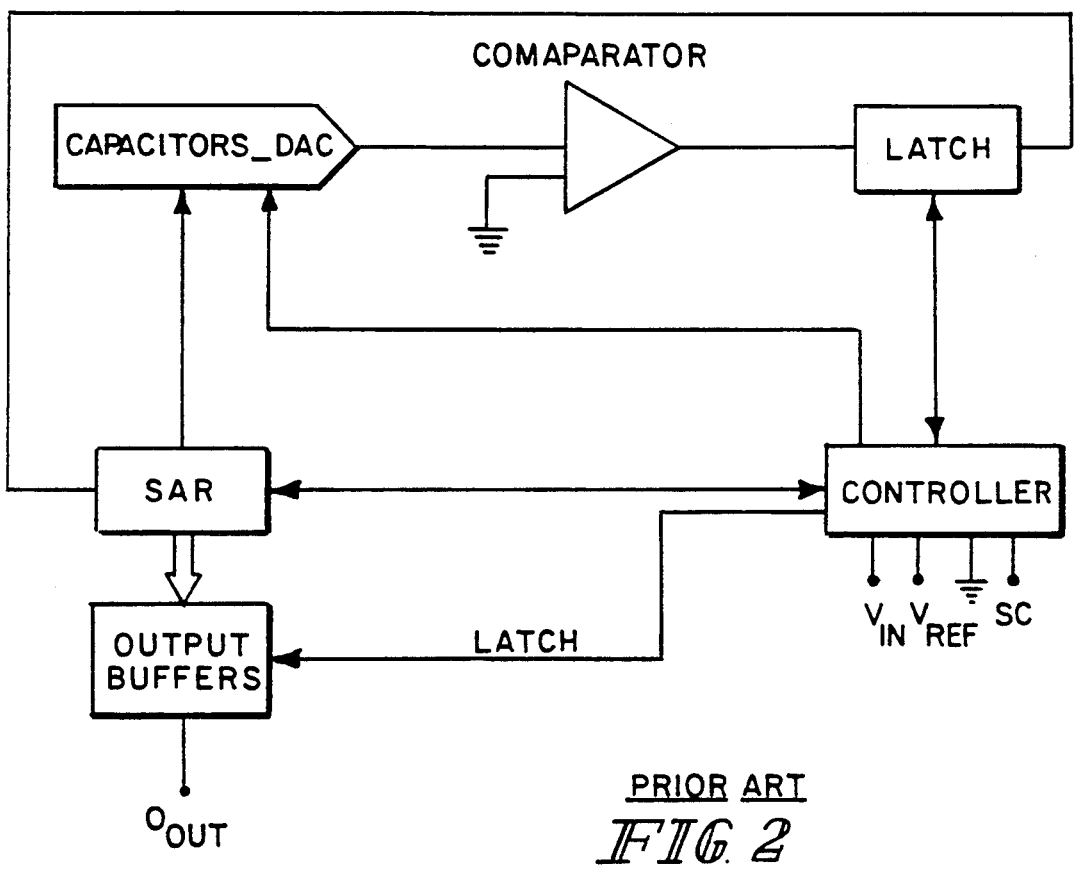
FIG. 2 is a block diagram of an analog-to-digital converter having a capacitive DAC of the prior art.
Figure 4:
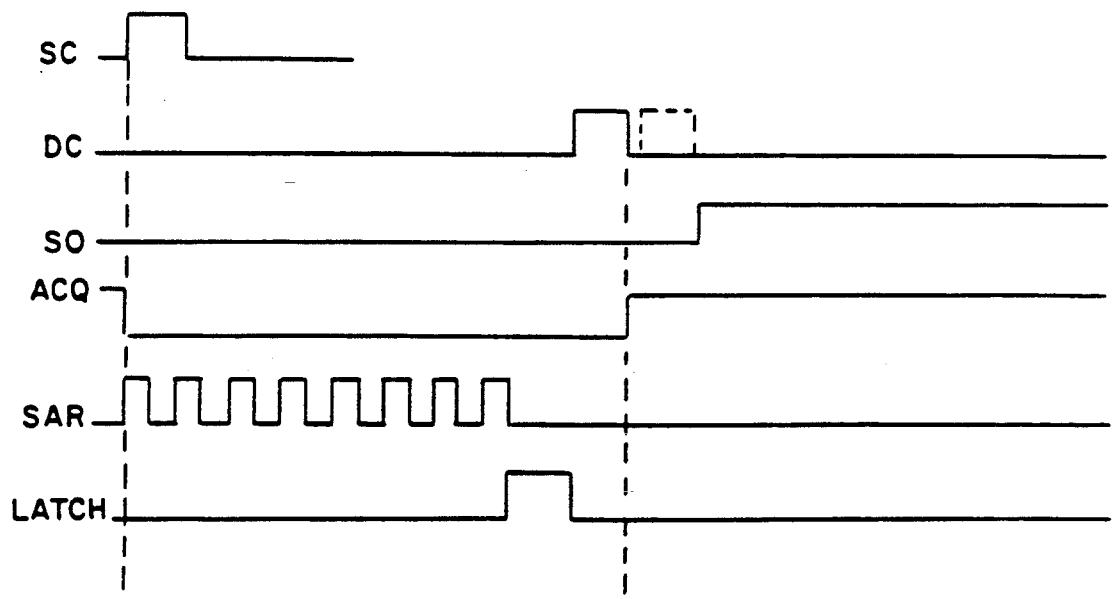
FIG. 4 is a series of graphs of signals illustrating the sequence of operation of an analog-to-digital converter incorporating the principles of the present invention.

The operation of the analog-to-digital converter using charge redistribution of a capacitive array of FIG. 2 is illustrated in the sequence of the graphs of FIG. 4. Upon the occurrence of a start command signal SC, the acquisition phase ACQ is terminated and the successive approximation routine SAR is initiated. Eight cycles for eight bits are performed. At the end of the conversion or the successive approximation routine, the final digital value is fixed by a latch, illustrated by the latch signal LATCH. After the final digital value has been fixed by the latch, the capacitors of the capacitive array are discharged by the signal DC. This is followed by the acquisition phase which begins with the acquisition signal ACQ. Upon an appropriate settling time allowing for the transient loading effects, the sampling of the offset of the comparator as represented by the signal SO begins.

With this back sampling technique, the aperture delay has been reduced to the aperture jitter. Since this technique requires previous cycles for the acquisition phase, the first cycle at power up will be discarded. The loss of a cycle is a small price to pay for minimizing aperture delay and jitter. By using the externally generated start command signal, instead of an internally generated ramp signal, aperture jitter is substantially reduced.

Figure 3:
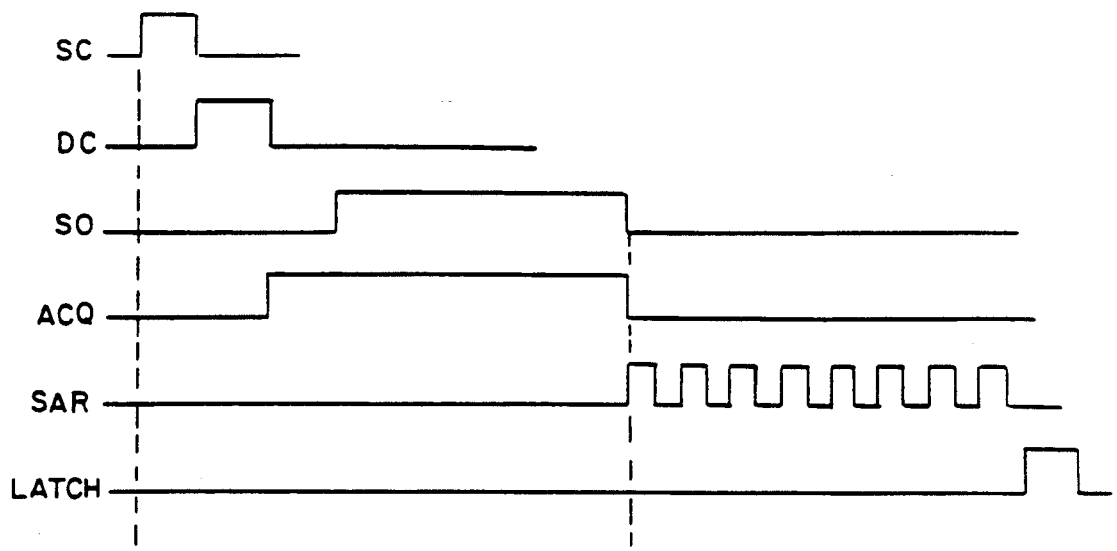
FIG. 3 is a series of graphs of signals displaying the sequence of operation of an analog to-digital converter of the prior art of FIG. 2.

The period of time of the different signals in FIG. 4 are the same as that of FIG. 3, with the exception of the acquisition signal ACQ. The discharge signal is approximately 100 nanoseconds, the sampling of the offset of the comparator is approximately 700 nanoseconds, and the successive approximation routine takes approximately 1 microsecond. Since the acquisition is conducted after the conversion or successive approximation routine, and is before the next start conversion command, it begins at the termination of the capacitor array discharge and continues until the next start conversion command signal. With an eight-bit analog-to-digital conversion time of approximately 1 microsecond, and a discharge, sample and offset and acquisition of approximately 1 microsecond, a two microsecond throughput rate can be produced with the present invention. In fabricated devices, an aperture jitter of less than 1 nanosecond has been measured.

Thus, it can be seen that by changing the sequence of operation, the aperture delay and aperture jitter are substantially reduced. The input analog voltage is disconnected terminating the acquisition cycle immediately upon receipt of the start conversion command. Similarly, the input to the capacitive array is switched back to the analog input port upon completion of the successive approximation such that the input circuitry can track the analog input. This occurs even though switches are being changed to discharge the capacitive array.

By using the external start conversion command signal instead of an internal signal generated by a ramp and comparator, the aperture jitter for the conversion cycle is substantially reduced. Also, by removing the other signals from the aperture window, aperture jitter does not accumulate before the conversion as in the prior art. The other signal DC, SO, SAR and latch are generated using a ramp and comparator, but have no detrimental effect, since they are outside the conversion.

Figure 1:
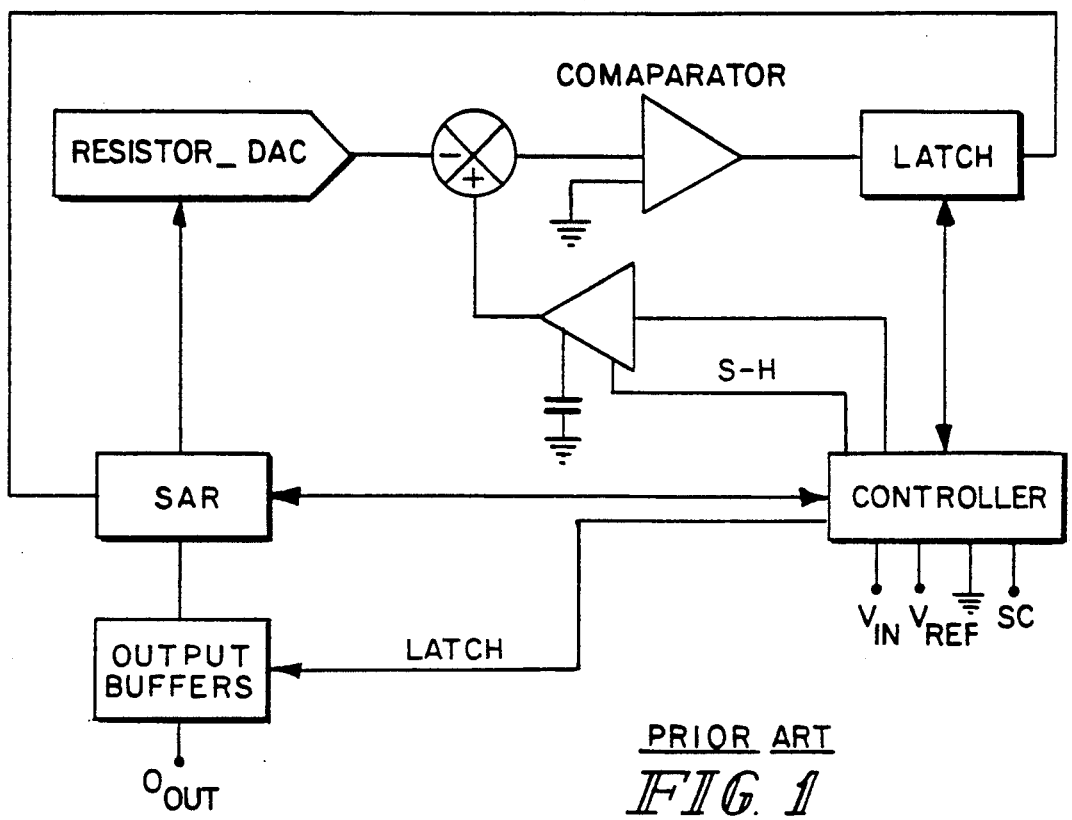
FIG. 1 is a block diagram of an analog-to-digital converter having a resistive DAC of the prior art.

With respect to the analog-to-digital converter including a resistive DAC of FIG. 1, the graphs of FIG. 3 show the sequence. As discussed above, the discharge capacitor signal DC would be used to reset the resistive DAC instead of the discharge of the capacitors in the capacitative DAC. Since the sample-and-hold is provided, the resetting of the DAC by the DC signal may occur during the acquisition signal as indicated in phantom or during the measuring of the offset of the comparators or the SO signal. The sample-and-hold of FIG. 1 is activated to sample the signal on the beginning of the acquisition signal ACQ and is set into the hold mode or end acquisition upon the occurrence of the start conversion command signal SC. Otherwise, the graphs of FIG. 4 show the improved operation of an analog-to-digital converter of FIG. 1 according to the principles of the present invention. This resistor DAC includes an R-2R array.

It should also be noted that the sampling of the offset or the SO signal may be eliminated from the routine if it is not considered necessary. If the comparators in the analog-to-digital converters of FIGS. 1 and 2 are MOS or CMOS technology, the offset voltage is usually large and should be measured and compensated. If bipolar technology is used, the tolerances of the circuits are substantially tighter and therefore the offset measurement and compensation need not be performed, especially in lower bit converters.

Although the present invention has been described and illustrated in detail, it is to be clearly understood that the same is by way of illustration and example only, and is not to be taken by way of limitation. An eight-bit converter was used for purposes of illustration and other capacity or length converters may use the present invention. Also the times for the different pulse width are for examples and will vary with application and device parameters. The spirit and scope of the present invention are to be limited only by the terms of the appended claims.

What is claimed:

1. A method of performing analog to digital conversion using an array, comprising in sequence:
   terminating acquisition of an analog input signal upon occurrence of a start conversion command;
   successively approximating a digital value of said analog input signal using said array;
   fixing said digital value upon completion of said successive approximation; and
   initiating acquisition of an analog input signal after fixing said digital value and before a leading edge of said start conversion command.

2. A method according to claim 1, wherein said approximating begins immediately after termination of acquisition.

3. A method according to claim 1, wherein acquisition includes initiating sampling of said analog signal from after completion of said approximating step and holding said sampled signal upon occurrence of said start conversion command.

4. A method according to claim 1, including resetting said array after said fixing step.

5. A method according to claim 4, wherein said resetting step and said initiating acquisition step occur simultaneously.

6. A method according to claim 1, wherein said successively approximating includes:
   successively storing digital values in a register;
   converting stored digital values into analog values using said array; and comparing converted analog values with acquired analog input signal.

7. In an analog to digital converter having an analog input means, a digital to analog converter means, a successive approximation register means, comparator means for comparing an analog input signal acquired by said analog input means with an analog signal converted by said converter means from a digital signal from said register means, digital output means and control means responsive to a start conversion command for controlling the sequence of acquisition of an input analog signal by said analog input means, resetting said converter means, successive approximation of a digital value of an acquired analog input signal by said converter, comparator and register means and outputting a digital value on said digital output means, the improvement comprising said control means which in response to a start conversion command produces in sequence:

termination of acquisition of an input analog signal by said analog input means;

successively approximating a digital value of said acquired analog input signal by said converter, comparator and register means;

outputting said digital value on said digital output upon completion of said successive approximation; and initiating acquisition of an input analog signal after fixing said digital value and before a leading edge of said start conversion command.

8. A converter according to claim 7, wherein said control means initiates said successive approximation immediately after termination of acquisition.

9. A converter according to claim 7, wherein said converter means includes a binary weighted array.

10. A converter according to claim 7, wherein said array is a resistive R-2R array.

11. A converter according to claim 7, wherein said analog input means includes a sample and hold and said control means controls said analog input means to initiate sampling of said analog signal from after completion of approximation and holding said sampled signal upon occurrence of said start conversion command.

12. A converter according to claim 7, wherein said control means resets said converter means and initiates acquisition simultaneously.

* * * * *